US008531806B2

(12) United States Patent  
Jalilizeinali et al.

(10) Patent No.: US 8,531,806 B2  
(45) Date of Patent: Sep. 10, 2013

(54) DISTRIBUTED BUILDING BLOCKS OF R-C CLAMPING CIRCUITRY IN SEMICONDUCTOR DIE CORE AREA

(75) Inventors: Reza Jalilizeinali, San Diego, CA (US); Evan Siansuri, San Diego, CA (US); Sreeker R. Dundigal, San Diego, CA (US); Eugene R. Worley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 111 days.

(21) Appl. No.: 13/173,977

(22) Filed: Jun. 30, 2011

(65) Prior Publication Data

US 2012/0224284 A1    Sep. 6, 2012

Related U.S. Application Data

(60) Provisional application No. 61/447,760, filed on Mar. 1, 2011.

(51) Int. Cl.  
*H02H 3/22* (2006.01)

(52) U.S. Cl.  
USPC ............................................ 361/56; 361/111

(58) Field of Classification Search  
USPC .................................................. 361/56, 111  
See application file for complete search history.

(56) References Cited

U.S. PATENT DOCUMENTS

| | | | |
|---|---|---|---|
| 7,115,952 B2 * | 10/2006 | Woo et al. ...................... 257/355 |
| 2003/0102813 A1 * | 6/2003 | Humphrey et al. ......... 315/169.3 |
| 2004/0125521 A1 | 7/2004 | Salling et al. |
| 2005/0093071 A1 * | 5/2005 | Wu ................................. 257/355 |
| 2006/0077601 A1 * | 4/2006 | Ikeda et al. ..................... 361/56 |
| 2006/0259892 A1 | 11/2006 | McGrath et al. |
| 2007/0019345 A1 * | 1/2007 | Loh et al. ........................ 361/56 |
| 2007/0285854 A1 | 12/2007 | Rodgers et al. |
| 2009/0189194 A1 | 7/2009 | Schroeder et al. |

OTHER PUBLICATIONS

International Search Report and Written Opinion—PCT/US2012/027337—ISA/EPO—Jun. 22, 2012.

* cited by examiner

*Primary Examiner* — Danny Nguyen  
(74) *Attorney, Agent, or Firm* — Sam Talpalatsky; Nicholas J. Pauley; Joseph Agusta

(57) ABSTRACT

A semiconductor die includes resistor-capacitor (RC) clamping circuitry for electrostatic discharge (ESD) protection of the semiconductor die. The RC clamping circuitry includes building blocks distributed in the pad ring and in the core area of the semiconductor die. The building blocks include at least one capacitor block in the core area. The RC clamping circuitry also includes chip level conductive layer connections between each of the distributed building blocks.

24 Claims, 4 Drawing Sheets

DISTRIBUTED BUILDING BLOCKS OF R-C
CLAMPING CIRCUITRY IN
SEMICONDUCTOR DIE CORE AREA

CROSS REFERENCE TO RELATED
APPLICATIONS

This application claims the benefit of provisional patent application No. 61/447,760, filed Mar. 1, 2011, which is incorporated herein by reference.

TECHNICAL FIELD

The present disclosure relates generally to semiconductor circuits providing protection against potentially damaging excess voltages, including as examples excess voltages resulting from electrical overstress (EDS) and/or electrostatic discharge (ESD) events.

BACKGROUND

Modern integrated circuits (ICs) are easily damaged by excess voltages, Common sources of these potentially damaging voltages include electrical overstress (EOS) and electrostatic discharge (ESD). ESD, a serious issue in solid state electronics, is a transfer of electrostatic charge between bodies or surfaces at different electrostatic potentials either through direct contact or through an induced electrical field. ICs which are built using semiconductors, such as silicon, and insulating materials, such as silicon dioxide, can be permanently damaged when subjected to higher voltages that may be produced by ESD events.

Traditionally, on-chip circuits are employed to protect the IC during an ESD event. In conventional IC ESD protection schemes, special clamp circuits often shunt ESD current between the IC power supply rails and thereby protect sensitive internal elements of the IC from damage. Such clamping circuits have a timer circuit (e.g., a resistor-capacitor (RC) timer, which may be referred to as a "transient detector") and a large n-channel MOSFET device for discharging the high ESD current. Thus, a power rail clamp circuit is often employed within an IC so that if an ESD event is encountered on the IC's power rail, the clamp will turn on and reduce the voltage so that the IC's main devices (circuitry elements) will not be damaged. Implementations and use of such RC clamps are well-known in the art.

The RC-clamp size is very large and uses most or all of the chip's metal layers to provide low resistance and high current handling capability. Previously, the RC timer and inverter portions of the RC clamp have been located in one pad (in the pad ring) and large field effect transistors (bigfets) have been distributed across the chip's pad-ring. In other previous implementations, the RC clamp has been configured as a very large one piece RC-clamp containing all the building blocks. Each of these designs occupies a large portion of the chip's metal layers and thereby greatly constrains routing options for the chip's other functional components.

SUMMARY

Embodiments of the present disclosure include an RC-clamp design which reduces conductive layer usage by distributing building blocks of the RC-clamp in the core area of the flip chip.

One aspect of the present disclosure provides an apparatus including a semiconductor die having a core area and a pad ring. The core area includes a timer based clamp, e.g., RC clamping circuitry configured for ESD protection of the semiconductor die. The RC clamping circuitry includes distributed building blocks having at least one capacitor block in the core area. The RC clamping circuitry also includes chip level conductive (e.g., metal) layer connections between each of the distributed building blocks.

In another aspect, a method is provided for configuring clamping circuitry on a semiconductor die. The method includes configuring clamping circuitry building blocks including at least one capacitor block in a core area of the semiconductor die. The method also includes coupling the distributed building blocks through chip level conductive layers of the semiconductor die.

This has outlined, rather broadly, the features and technical advantages of the present disclosure in order that the detailed description that follows may be better understood. Additional features and advantages of the disclosure will be described below, It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

One weakness of traditional timer based clamp circuitry designs is that the timer based clamp occupies a large area and it uses a large portion of the conductive (e.g., metal) layers to handle ESD current. This introduces problems at the block or chip level because significant area is allocated to place the timer based (e.g., RC) clamps, increasing the difficulty to route signals in the core area due to the conductive layer blockages within the timer based clamps.

According to aspects of the present disclosure, these issues with traditional timer based clamp implementations may be alleviated by distributing building blocks of the timer based clamps. The distributed timer based clamp could be applied in a flip chip configuration or any other chip configuration.

Figure 1A:
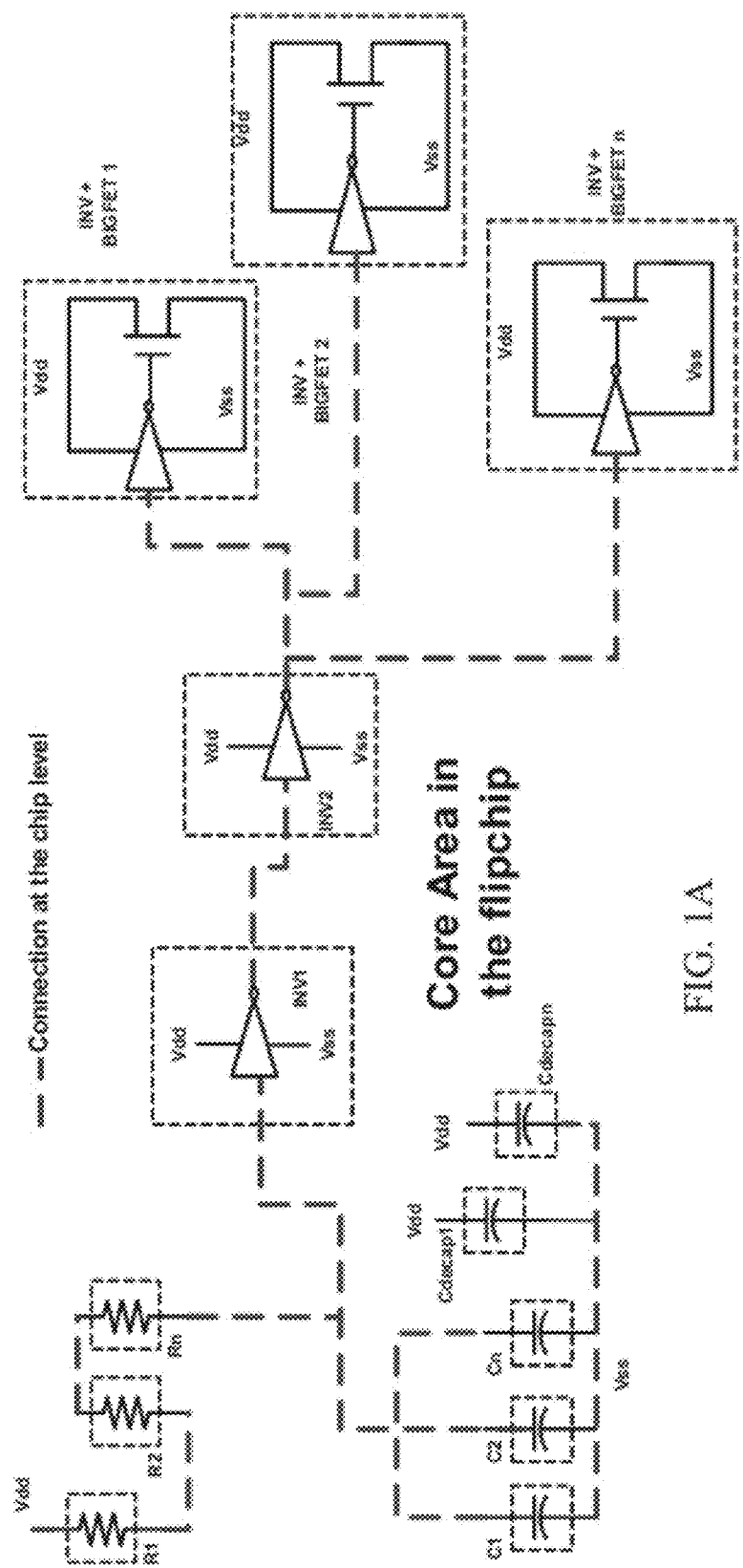
FIGS. 1A and 1B are schematic diagrams conceptually illustrating examples of distributed RC-clamp circuitry according to aspects of the present disclosure.
Figure 1B:
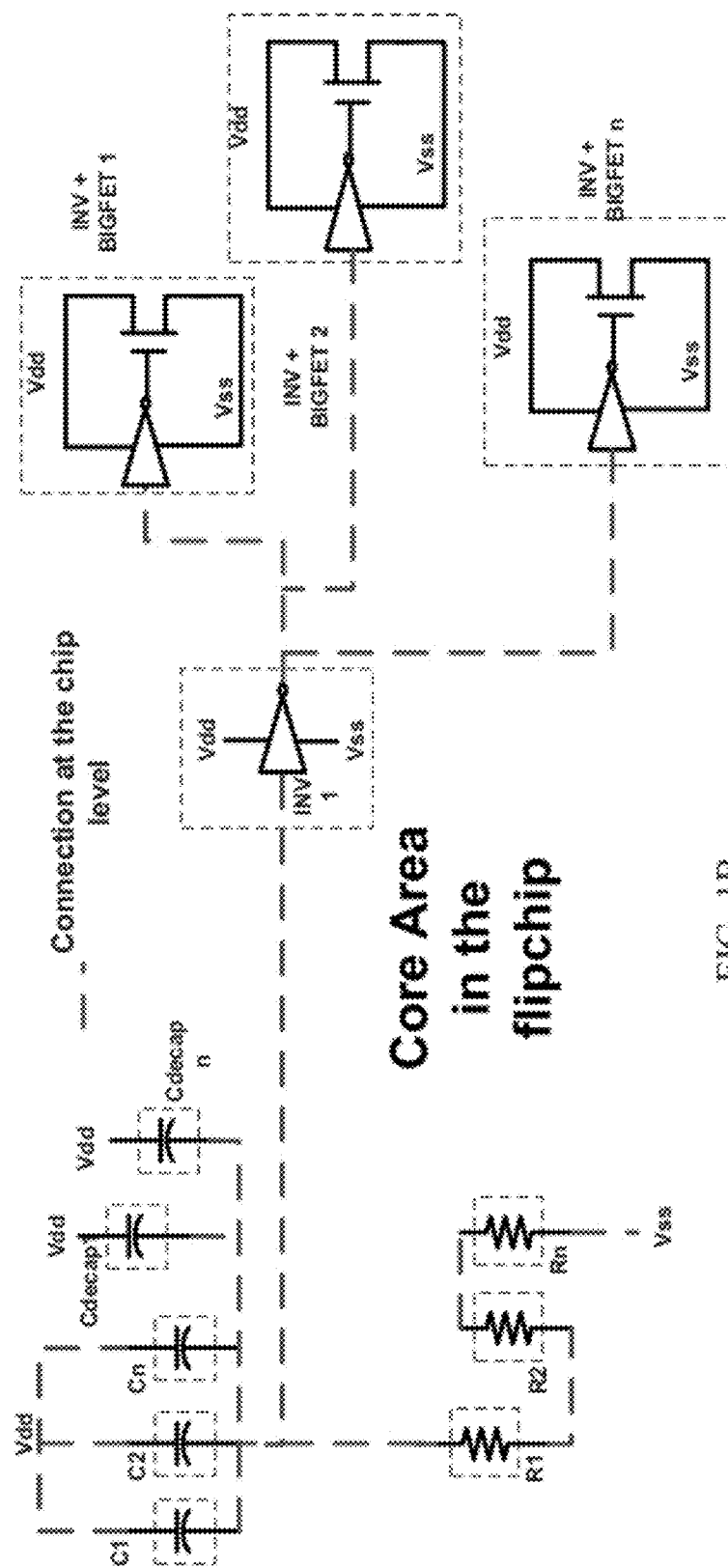

FIG. 1A is a block diagram of an exemplary timer based clamp circuit in which components of the timer based circuit such as resistors and capacitors are distributed apart from each other in the core area of a semiconductor die. In this example the distributed timer based clamp circuit is an RC-clamp. The RC-clamp is divided into smaller building blocks such as resistors R1, R2, . . . Rn, capacitors C1, C2 . . . Cn, Cdecap1 . . . Cdecapn, inverters INV1, INV2 . . . and inverter plus bigfet INV+BIGFET1, INV+BIGFET2, . . . INV+HBIGFETn. In this exemplary topology, resistors R1, R2, . . . Rn are coupled in series to node Vdd and capacitors C1, C2 . . . Cn, Cclecap1 . . . Cdecapn are coupled to node Vss. FIG. 1B shows an alternative exemplary topology in which resistors R1, R2, . . . Rn are coupled in series to node Vss and capacitors C1, C2 . . . Cn, Cdecap1 . . . Cdecapn are coupled to node Vdd. It should be understood that, in view of the present disclosure, various other topologies could be configured by persons having ordinary skill in the art within the scope of the present disclosure. For example, the resistors and capacitors could be combined into a single component, or into a single component also including one or more inverters. In another example, the inverters are replaced by 2-input NAND gates tied together. According to aspects of the present disclosure, the various topologies may be shaped or reshaped to meet certain design goals, for example to fill unused area on a chip.

Although FIG. 1A and FIG. 1B show multiple inverters plus bigfet building blocks, it should be understood that examples of the present disclosure may include various numbers of each component, for example 5, 7 or 9, etc. inverters, instead of three, as shown in FIG. 1A, or 4, 6, 8, etc. inverters, instead of 2 as shown in FIG. 1B. The coupling between the building blocks occurs in the chip level conductive layers. The coupling is configured to satisfy RC timing (number of resistor and capacitor building blocks), RC clamp turn on time (maximum additional loading introduced by metal routings), and RC-clamp clamping voltages number of inv plus bigfets to achieve good clamping characteristics), Unused capacitors distributed in the core area can be used as decoupling capacitors. As seen in FIG. 1A, the dashed lines represent couplings at the chip level between components of the RC clamp. Such coupling at the chip level according to aspects of the present disclosure avoid routing difficulties and routing blockage that could be encountered using previously known one piece RC clamps that include couplings through the chip level conductive layers, for example.

Embodiments of the present disclosure provide an ability to take advantage of unused area in the core area or an area inside a hard macro (of a microprocessor, etc) for placing RC clamp components, such as capacitor blocks, The conductive layer routing blockages suffered by traditional RC-clamp techniques is avoided by distributing the building blocks of the RC clamp. The distributed capacitors in the core area can be used as the building blocks of the RC-clamp or as decoupling capacitors.

Figure 2:
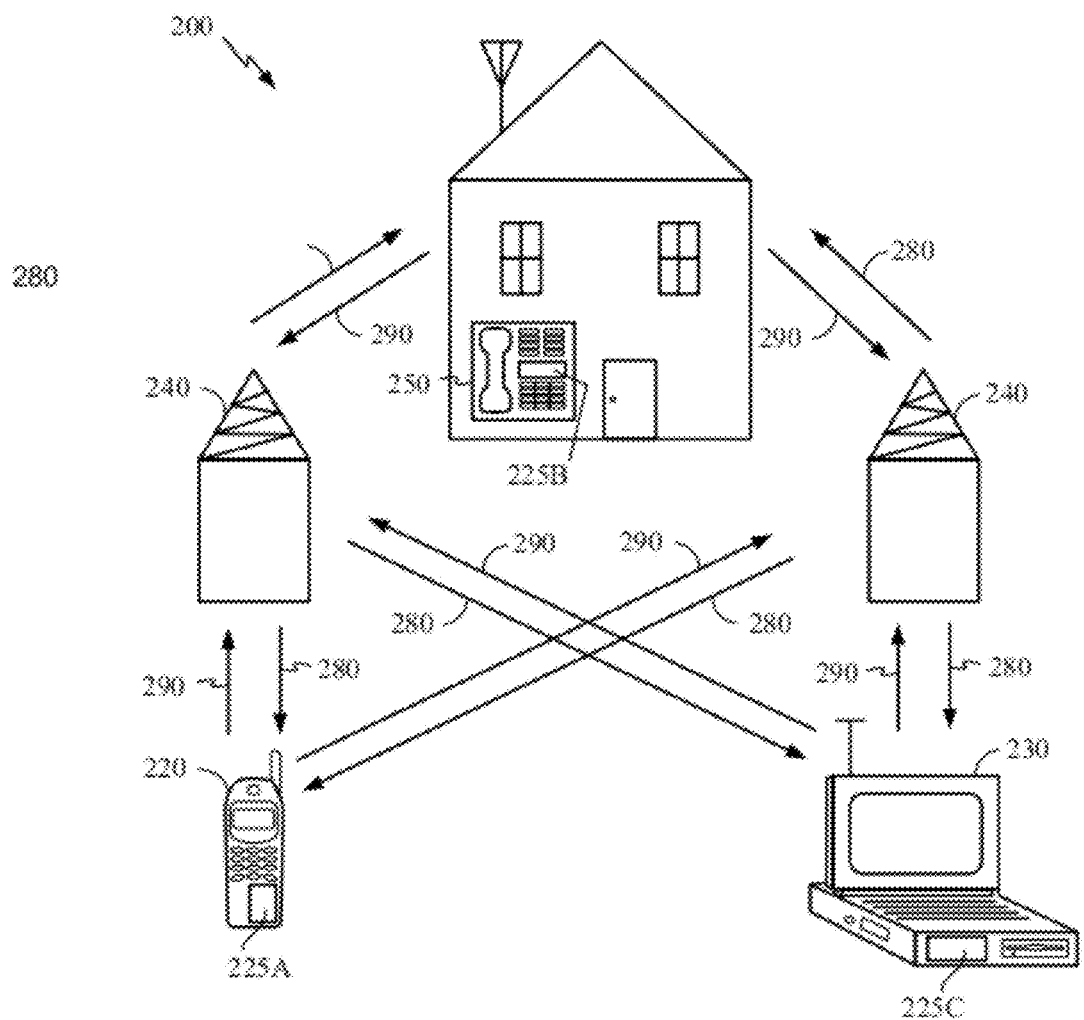
FIG. 2 shows an exemplary wireless communication system in which an embodiment of the disclosure may be advantageously employed.

FIG. 2 shows an exemplary wireless communication system 200 in which an embodiment of the distributed RC clamp may be advantageously employed, For purposes of illustration, FIG. 2 shows three remote units 220, 230, and 250 and. two base stations 240. It will be recognized that wireless communication systems may have many more remote units and base stations. Remote units 220, 230, and 250 include the distributed ESD circuitry 225A, 225B, and 225C, respectively. FIG. 2 shows forward link signals 280 from the base stations 240 and the remote units 220, 230, and 250 and reverse link signals 290 from the remote units 220, 230, and 250 to base stations 240.

In FIG. 2, the remote unit 220 is shown as a mobile telephone, remote unit 230 is shown as a portable computer, and remote unit 250 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 2 illustrates remote units, which may employ distributed RC clamp circuitry according to the teachings of the disclosure, the disclosure is not limited to these exemplary illustrated units. For instance, distributed RC clamp circuitry according to embodiments of the present disclosure may be suitably employed in any device.

Figure 3:
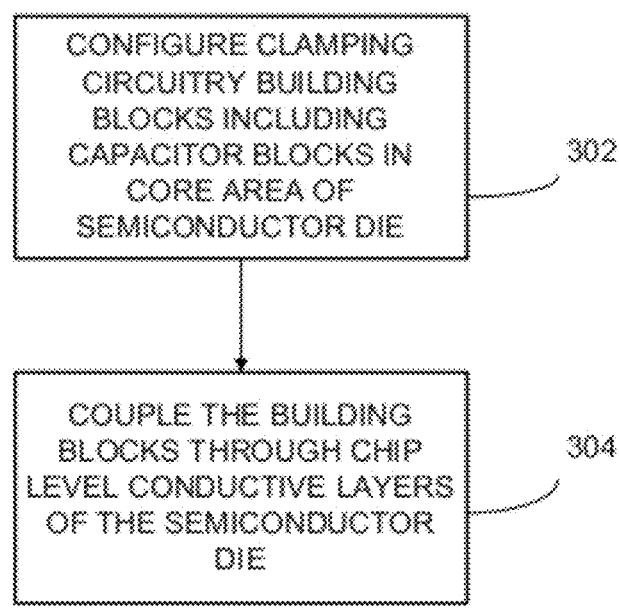
FIG. 3 is a process flow diagram illustrating a method for configuring a semiconductor die according to an aspect of the present disclosure.

A method for configuring a semiconductor die according to aspects of the present disclosure is described with reference to FIG. 3. In block 302, timer based clamping circuitry building blocks, including capacitor blocks, are configured in the core area of the semiconductor die. In block 304, the distributed building blocks are coupled through chip level conductive layers of the semiconductor die, Although aspects of the present disclosure have been described herein with reference to RC clamp circuitry, it should be understood by persons having ordinary skill in the art that the disclosure more generally describes the distribution of components of a timer based clamp in the core area. Within the scope of the present disclosure, the various components of the circuitries inside the clamps are not limited to specific types of circuit elements or components. For example, according to aspects of the present disclosure, timer based clamps are not limited to RC clamps. In one example, a resistor and capacitor may be combined into a single component or may he combined with an inverter or the like within a single component. In another example, the inverters of the timer based clamps may be replace by various equivalent or similar logic circuitry, such as a 2-input nand gate in which the inputs are tied together.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to he developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a semiconductor die including a core area and a pad ring;
resistor-capacitor (RC) clamping circuitry configured for electro-static discharge (ESD) protection of the semiconductor die, the RC clamping circuitry including a plurality of capacitor blocks distributed in the core area, a first capacitor portion of the RC clamping circuitry in a first location of the core area, a first resistor portion of the RC clamping circuitry in a second location of the core area apart from the first capacitor portion of the RC clamping circuitry; and
a plurality of chip level conductive layers coupling the first capacitor portion of the RC clamping circuitry to the first resistor portion of the RC clamping circuitry.

2. An apparatus comprising:
a semiconductor die including a core area and a pad ring;
timer based clamping circuitry configured in the core area, the clamping circuitry including distributed building blocks in the core area, the distributed building blocks including at least one capacitor block of the clamping circuitry configured in the core area and
a plurality of chip level conductive layers coupling the distributed building blocks,
in which the building blocks comprise:
resistor blocks, capacitor blocks, inverter blocks and inverter plus bigfet blocks.

3. The apparatus of claim 2, comprising:
a plurality of sub-blocks, in which at least one of the resistor blocks, capacitor blocks, inverter blocks and inverter plus bigfet blocks is divided into the plurality of sub-blocks; and
chip level conductive layer components between each of the sub-blocks.

4. The apparatus of claim 2, in which a number of resistor blocks and a number of capacitor blocks are configured to provide a selected resistor-capacitor (RC) timing.

5. The apparatus of claim 2, in which the chip level conductive layers are configured to provide a selected resistor-capacitor (RC) clamp turn-on time.

6. The apparatus of claim 2, in which a number of inverter plus bigfet blocks is configured to provide a selected resistor-capacitor (RC)-clamp clamping voltage.

7. The apparatus of claim 2, in which at least one of the capacitor blocks is configured as a decoupling capacitor.

8. The apparatus of claim 1, integrated into a mobile phone, a set top box, a music player, a video player, an entertainment unit, a navigation device, a computer, a hand-held personal communication systems (PCS) unit, a portable data unit, and/or a fixed location data unit.

9. A method of configuring electro-static discharge (ESD) protection circuitry on a semiconductor die, comprising:
distributing clamping circuitry building blocks including a plurality of capacitor blocks and a plurality of resistor blocks apart from each other in a core area of the semiconductor die; and
coupling selected combinations of the clamping circuitry building blocks through a plurality of chip level conductive layers of the semiconductor die.

10. A method of configuring clamping circuitry on a semiconductor die, comprising:
configuring clamping circuitry building blocks including at least one capacitor block in a core area of the semiconductor die; and
coupling the building blocks through a plurality of chip level conductive layers of the semiconductor die,
in which the building blocks comprise:
resistor blocks, capacitor blocks, inverter blocks and inverter plus bigfet blocks.

11. The method of claim 10, comprising:
dividing at least one of the resistor blocks, capacitor blocks, inverter blocks and inverter plus bigfet blocks into a plurality of sub-blocks; and
configuring chip level conductive layer connections between each of the sub-blocks.

12. The method of claim 10, comprising:
configuring a number of the resistor blocks and a number of the capacitor blocks to provide a selected resistor-capacitor (RC) timing.

13. The method of claim 10, comprising:
configuring the chip level conductive layers to provide a selected resistor-capacitor (RC) clamp turn-on time.

14. The method of claim 10, comprising:
configuring a number of inverter plus bigfet blocks to provide a selected resistor-capacitor (RC)-clamp clamping voltage.

15. The method of claim 10, comprising:
configuring at least one of the capacitor blocks as a decoupling capacitor.

16. The method of claim 9, further comprising:
integrating the semiconductor die into a mobile phone, a set top box, a music player, a video player, an entertainment unit, a navigation device, a computer, a hand-held personal communication systems (PCS) unit, a portable data unit, and/or a fixed location data unit.

17. A method of configuring electro-static discharge (ESD) protection circuitry on a semiconductor die, comprising the steps of:
distributing clamping circuitry building blocks including a plurality of capacitor blocks and a plurality of resistor blocks apart from each other in a core area of the semiconductor die; and
coupling selected combinations of the clamping circuitry building blocks through a plurality of chip level conductive layers of the semiconductor die.

18. A method of configuring clamping circuitry on a semiconductor die, comprising the steps of:
configuring clamping circuitry building blocks including at least one capacitor block in a core area of the semiconductor die; and
coupling the building blocks through a plurality of chip level conductive layers of the semiconductor die,
in which the building blocks comprise:
resistor blocks, capacitor blocks, inverter blocks and inverter plus bigfet blocks.

19. The method of claim 18, comprising the steps of:
dividing at least one of the resistor blocks, capacitor blocks, inverter blocks and inverter plus bigfet blocks into a plurality of sub-blocks; and
configuring chip level conductive layer connections between each of the sub-blocks.

20. The method of claim 17, further comprising the step of:
integrating the semiconductor die into at least one of a mobile phone, a set top box, a music player, a video player, an entertainment unit, a navigation device, a computer, a hand-held personal communication systems (PCS) unit, a portable data unit, and/or a fixed location data unit.

21. The apparatus of claim 1, further comprising:
a second capacitor portion of the RC clamping circuitry in a third location of the core area apart from the first capacitor portion of the RC clamping circuitry, the chip level conductive layers further coupling the second capacitor portion of the RC clamping circuitry to the first capacitor portion of the RC clamping circuitry.

22. The apparatus of claim 1, further comprising:
a second resistor portion of the RC clamping circuitry located in a third location of the core area apart from the first capacitor portion of the RC clamping circuitry, the chip level conductive layers further coupling the second resistor portion of the RC clamping circuitry to the first capacitor portion of the RC clamping circuitry.

23. An apparatus comprising:
a semiconductor die including a core area and a pad ring;
means for providing electro-static discharge (ESD) protection of the semiconductor die, the ESD protection means including a plurality of capacitor blocks distributed in the core area, a first capacitor portion of the ESD protection means in a first location of the core area, a first resistor portion of the ESD protection means in a second location of the core area apart from the first capacitor portion; and
a plurality of chip level conductive layers coupling the first capacitor portion to the first resistor portion.

24. The apparatus of claim 23, integrated into a mobile phone, a set top box, a music player, a video player, an entertainment unit, a navigation device, a computer, a hand-held personal communication systems (PCS) unit, a portable data unit, and/or a fixed location data unit.

* * * * *